United States Patent [19]

Nukii et al.

[11] 4,420,364
[45] Dec. 13, 1983

[54] HIGH-INSULATION MULTI-LAYER DEVICE FORMED ON A METAL SUBSTRATE

[75] Inventors: Takashi Nukii, Nara; Shigeo Nakabu, Nara; Masaru Iwasaki, Izumisano; Katsunobu Awane, Ikoma, all of Japan

[73] Assignee: Sharp Kabushiki Kaisha, Osaka, Japan

[21] Appl. No.: 379,722

[22] Filed: May 19, 1982

Related U.S. Application Data

[60] Division of Ser. No. 42,951, May 29, 1982, which is a continuation of Ser. No. 847,912, Nov. 2, 1977, abandoned.

[30] Foreign Application Priority Data

Nov. 2, 1976 [JP] Japan .................................. 51-132121
Mar. 24, 1977 [JP] Japan .................................. 52-33064

[51] Int. Cl.³ .................... B44C 1/22; C03C 15/00; C03C 25/06; C23F 1/02
[52] U.S. Cl. .................................. 156/631; 29/846; 156/634; 156/650; 156/656; 156/901; 174/68.5
[58] Field of Search .................. 427/96, 97, 98; 156/630, 631, 633, 634, 656, 659.1, 901, 902, 241, 235, 233, 237, 650; 174/68.5; 430/313, 316, 318; 29/848, 852, 829, 846

[56] References Cited

U.S. PATENT DOCUMENTS 3,152,938 10/1964 Osifchin et al. .................. 156/901 X
3,688,396 9/1972 Kilby et al. ...................... 174/68.5 X
3,947,957 4/1976 Luttmer ............................ 29/589 X Primary Examiner—William A. Powell
Attorney, Agent, or Firm—Birch, Stewart, Kolasch & Birch

[57] ABSTRACT

A high-insulation adhesive sheet is formed on a metal substrate. Bottom conductors are formed on the high-insulation adhesive sheet. A high-insulation organic layer is formed on the high-insulation adhesive sheet and the bottom conductors, and top conductors are formed thereon. The high-insulation organic layer is tightly attached to the metal substrate via the high-insulation adhesive sheet. The bottom conductors and the top conductors are communicated to each other via through holes formed in the high-voltage organic layer.

3 Claims, 33 Drawing Figures

*PRIOR ART*

HIGH-INSULATION MULTI-LAYER DEVICE FORMED ON A METAL SUBSTRATE

This application is a divisional of copending application Ser. No. 042,951, filed on May 29, 1982 which is a continuation of Ser. No. 847,912, filed on Nov. 2, 1977, now abandoned.

BACKGROUND OF THE INVENTION

The present invention relates to a multi-layer substrate, including laminated conductor layers and insulation layers, for carrying an integrated semiconductor chip.

Generally, the multi-layer wirings are achieved through the use of plural printed circuit boards, a thick film method and printing techniques. There are several methods utilizing the printing techniques.

1. Conductor layers and insulator layers are laminated by alternatingly printing them and firing them.
2. Conductor patterns are printed on a green ceramic substrate. Plural of the thus formed green ceramic substances are stacked and attached to each other to form a laminated ceramic substrate.
3. Conductor layers and insulator layers are alternatingly printed on a green ceramic substrate, and they are sintered at the final step. This method is termed as a green sheet printing method.

The above-mentioned conventional multi-layer substrate is not suited for a high power chip, since the base plate is made of either ceramics or glass. Moreover, the conventional multi-layer substrate does not show satisfying high-insulation characteristics.

OBJECTS AND SUMMARY OF THE INVENTION

Accordingly, an object of the present invention is to provide a multi-layer substrate showing high-insulation characteristics.

Another object of the present invention is to provide a multi-layer device formed on a metal substrate for high power.

Still another object of the present invention is to provide a multi-layer substrate suited for carrying a high power semi-conductor chip.

Yet another object of the present invention is to enhance the density of conductor patterns formed in a multi-layer substrate.

A further object of the present invention is to simplify the fabrication of a multi-layer substrate.

Other objects and further scope of applicability of the present invention will become apparent from the detailed description given hereinafter. It should be understood, however, that the detailed description and specification examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a high-insulation adhesive sheet, such as a polyamic acid film and a polyamideimide film, for example, KERIMIDE 501 fabricated by RHÔNE-POULENC, France, is formed on a metal substrate made of, for example, an aluminum plate. An opening is formed in the high-insulation adhesive sheet for securing a semiconductor chip therein, that is, the semiconductor chip is formed directly on the metal substrate. The high-insulation adhesive sheet is half-cured hardened to attach to the metal substrate. Bottom conductors are formed on the high-insulation adhesive sheet. The bottom conductors are made of, for example, aluminum, nickel or copper and shaped in a desired configuration through the use of photo-etching techniques.

A high-insulation organic layer, such as a polyimide film, a polyamic acid film or a polyamideimide film is formed on the high-insulation adhesive sheet to cover the bottom conductors formed on the high-insulation adhesive sheet. Thereafter, the high-insulation adhesive sheet is completely hardened to tightly attach the high-insulation organic layers to the metal substrate via the high-insulation adhesive sheet. An opening is formed in the high-insulation organic layer at the position corresponding to the opening formed in the high-insulation adhesive sheet, whereby the semiconductor chip is secured in the opening. Top conductors are formed on the high-insulation organic layer. The top conductors are made of, for example, aluminum, nickel or copper and shaped in a desired configuration through the use of photo-etching techniques. Through holes are formed in the high-insulation organic layer to electrically communicate the top conductors to the bottom conductors.

In a preferred form, the electrical communication between the top conductors and the bottom conductors is formed at the same time when the top conductors are formed on the high-insulation organic layer through the use of ion deposition techniques such as evaporation techniques, a spattering method and a cluster method.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Referring now in detail to the drawings, and to facilitate a more complete understanding of the present invention, a multi-layer substrate of the prior art will be first described with reference to FIGS. 1(A) through 1(E).

The multi-layer substrate of FIGS. 1(A) through 1(E) is formed through the use of conventional printing techniques, wherein conductor layers and insulator layers are laminated by alternatingly printing them and firing them.

Figure 1A:
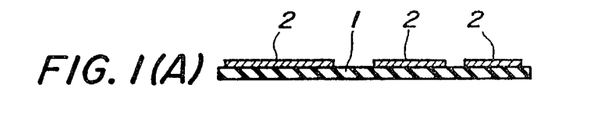
FIGS. 1(A) through 1(E) are schematic sectional views showing fabrication steps of a multi-layer substrate of the prior art.

Conductor paste is printed on a rigid substrate 1 made of ceramics or glass through the use of a screen printing method, thereby forming bottom conductors 2 on the rigid substrate 1 as shown in FIG. 1(A).

An insulation layer 5 is formed on the rigid substrate 1 and the bottom conductors 2 by printing insulator paste by a screen printing method. The insulation layer 5 has plural through holes 3 and an opening 4 for securing a semiconductor chip therein, as shown in FIG. 1(B).

Figure 1B:
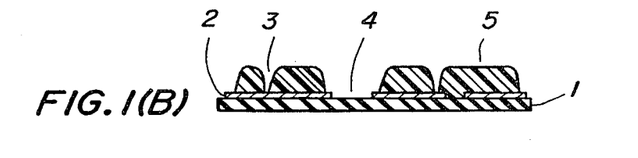
Figure 1C:
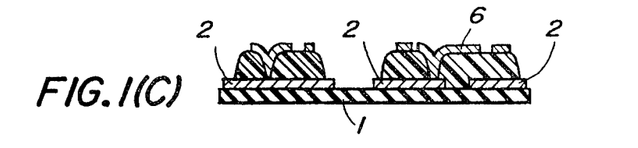

Top conductors 6 and electrical communications between the top conductors 6 and the bottom conductors 2 through the through holes 3 are formed by printing conductor paste on the insulation layer 5 through the use of a screen printing method as shown in FIG. 1(C).

The above-mentioned steps of FIGS. 1(B) and 1(C) are repeated to produce a multi-layer substrate. That is, the conductor layer and the insulator layers are alternatingly laminated.

Figure 1D:
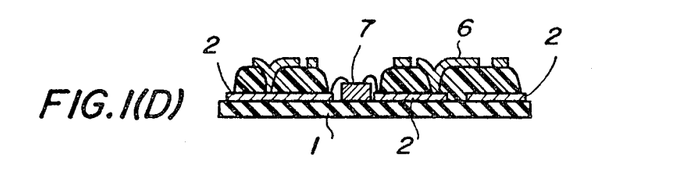

A semiconductor chip 7 is secured in the opening 4 so as to be supported directly on the rigid substrate 1. The semiconductor chip 7 is electrically connected to the bottom conductors 2 via lead wirings through the use of a die bond method and a wire bonding method as shown in FIG. 1(D).

Figure 1E:
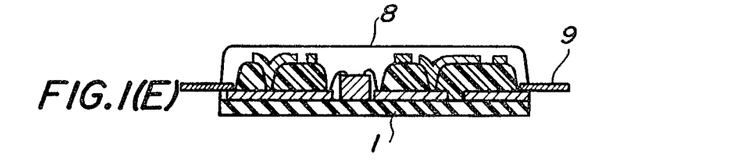

A protective coat 8 or a cap seal is formed above the abovementioned elements when required. Outer lead electrodes 9 are connected to the bottom conductors 2 for performing electrical communication to the external circuit elements as shown in FIG. 1(E).

The above constructed multi-layer substrate of the prior art has the following defects.

Since the conductors are formed through the screen printing method, the minimum line width is determined by viscosity of the conductor paste, the screen mesh, the squeeze speed, and the machine precision, etc. The minimum line width now available in the conventional multi-layer substrate is about 100 μm.

The through holes for communicating the top conductors and the bottom conductors to each other are formed through the use of the screen printing method. The minimum through hole size for ensuring the stable electrical communication in the conventional multi-layer substrate is above 200 μmφ. Accordingly, the wiring pitch of the bottom conductors can not be very short, and the wiring pattern area of the top conductors can not be sufficiently large.

Although the ceramic substrate and the glass substrate are suited for printing techniques, they do not show a high heat radiation factor. Therefore, the conventional multi-layer substrate is not suited for carrying a large power semiconductor chip.

Since the insulation layer of the conventional multi-layer substrate is formed through the screen printing method, there is a possibility that a pin-hole is created within the insulation layer. This will cause a break down when a high voltage is applied across the insulation layer, or cause increase of a leakage current due to migration. One way to eliminate the above-described pin-hole is to repeatedly print the paste. However, this will complicate the fabrication of the multi-layer substrate.

Figure 2:
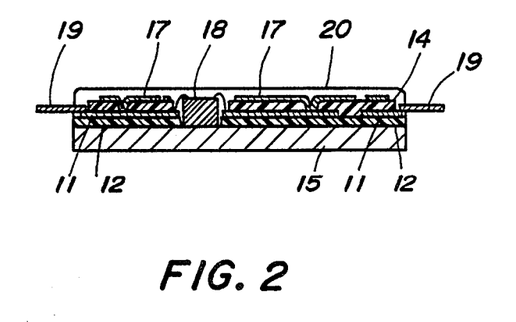
FIG. 2 is a schematic sectional view of an embodiment of a multi-layer substrate of the present invention.

FIG. 2 shows an embodiment of a multi-layer substrate of the present invention, which eliminates the above-mentioned defects of the conventional multi-layer substrate. FIGS. 3(A) through 3(G) show fabrication steps of the multi-layer of FIG. 2.

Figure 3A:
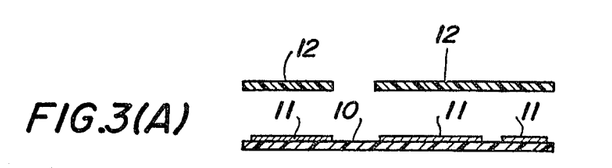
FIGS. 3(A) through 3(G) are schematic sectional views showing fabrication steps of the multi-layer substrate of FIG. 2.

A conductor pattern 11 is formed on a provisional substrate 10 through the use of photo-etching techniques as shown in FIG. 3(A). The conductor pattern 11 functions as the bottom conductors. A high-insulation adhesive sheet 12 is disposed above the provisional substrate 10 so as to attach to the conductor pattern 11. The provisional substrate 10 is made of material showing the following characteristics.

The adhesion of the adhesive sheet 12 to the conductor pattern 11 is greater than that of the provisional substrate 10 to the conductor pattern 11 when the adhesive sheet 12 is half-cured. And, the adhesion of the adhesive sheet 12 to the provisional substrate 10 is negligible.

The high-insulation adhesive sheet 12 can be KERIMIDE 501 fabricated by RHŌNE-POULENC, France, which shows adhesion characteristics during the curing process when it is heated under a certain pressure.

Figure 3B:
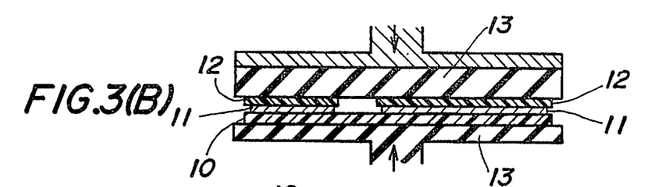

The high-insulation adhesive sheet 12 has an opening for securing a semiconductor chip therein. The high-insulation adhesive sheet 12 is depressed toward the provisional substrate 10 through the use of rubber pressing plates 13 as shown in FIG. 3(B). The rubber pressing plates 13 are heated up to a predetermined temperature to maintain the provisional substrate 10 and the high-insulation adhesive sheet 12 at a predetermined temperature. A preferred temperature is 90° C. for thirty (30) minutes, 150° C. for thirty (30) minutes, and then 200° C. for thirty (30) minutes.

Figure 3C:
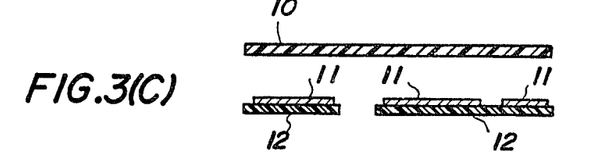

The high-insulation adhesive sheet 12 is half-cured to attach to the conductor pattern 11. Then, the high-insulation adhesive sheet 12 is separated from the provisional substrate 10. At this moment, the conductor pattern 11 is separated from the provisional substrate 10 and is attached to the adhesive sheet 12 as shown in FIG. 3(C).

Figure 3D:
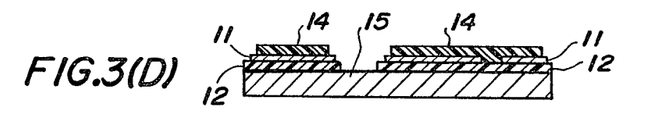

A high-insulation film 14 such as a polyimide film is secured on the adhesive sheet 12 in such a manner that the conductor pattern 11 is sandwiched between the adhesive sheet 12 and the high-insulation film 14. The high-insulation film 14 has an opening at a position corresponding to the opening formed in the adhesive sheet 12. A metal substrate 15 such as an aluminum plate or a copper plate is disposed below the adhesive sheet 12. And, then, the device is heated up to 250° C. for one (1) hour by the rubber pressing plates 13 shown in FIG. 3(B) to completely cure the adhesive sheet 12. The metal substrate 15, the adhesive sheet 12, the conductor pattern 11 and the high-insulation film 14 are tightly connected to each other as shown in FIG. 3(D). The metal substrate 15 and the conductor pattern 11 are completely electrically isolated from each other since the adhesive sheet 12 has the high-insulation characteristics.

Figure 3E:
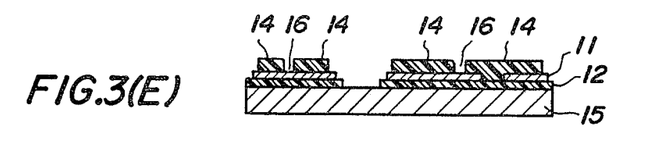
Figure 3F:
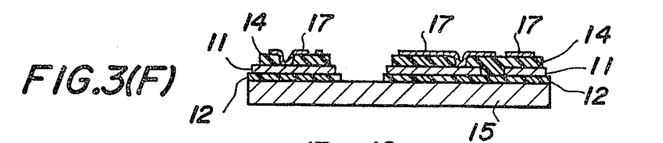

Through holes 16 are formed in the high-insulation film 14 as shown in FIG. 3(E) through the use photo-etching techniques. Thereafter, metal deposition is conducted through the use of ion deposition techniques such as an evaporation method, a spattering method and an ion cluster method to simultaneously form through hole contacts filled in the through holes 16 and top conductors 17 as shown in FIG. 3(F).

Figure 3G:
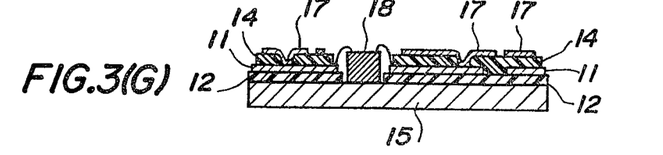

A semiconductor chip 18 such as a transistor, an IC and an LSI is disposed in the opening formed in the adhesive sheet 12 and the high-voltage film 14 so that the semiconductor chip 18 is attached to the metal substrate 15. Connection wirings are formed as shown in FIG. 3(G) through the use of die bond techniques and wire bonding techniques. The connection wirings can be formed through the use of face-up bonding techniques.

Outer leads 19 are attached to the bottom conductors 11, and a protective coat 20 is formed as shown in FIG. 2 when required.

Preferred materials of the provisional substrate 10, the conductor pattern 11, the adhesive sheet 12, the high-insulation film 14 and the metal substrate 15 are listed in the following TABLE I.

TABLE I

| PROVISIONAL SUBSTRATE | CONDUCTOR PATTERN | ADHESIVE SHEET | HIGH-INSULATION FILM | METAL SUBSTRATE |
| --- | --- | --- | --- | --- |
| ceramic plate coated with ceramic cathalic paste (CCP) | Ni (formed through electroless plating) | KERIMIDE | polyimide film | aluminum plate, or copper plate |
| ceramic plate | thick-film metal paste formed through printing method | " | polyimide film | aluminum plate, or copper plate |
| silicon wafer | multi-layer of aluminum or nickel through ion deposition techniques | " | polyimide film | aluminum plate, or copper plate |

In the above-mentioned multi-layer substrate, both of the bottom conductors and the top conductors are formed through the use of photo-etching techniques. Therefore, the minimum line width and the minimum space between adjacent two conductors can be 50 μm. The polyamideimide film never creates pin holes. The minimum through hole size can be below 70 μmϕ.

Figure 4:
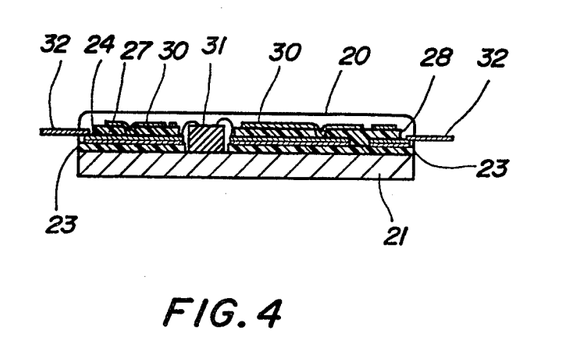
FIG. 4 is a schematic sectional view of another embodiment of a multi-layer substrate of the present invention.

FIG. 4 shows another embodiment of a multi-layer substrate of the present invention, wherein the bottom conductors are made of metal foil and shaped through the etching method. FIGS. 5(A) through 5(F) show fabrication steps of the multi-layer substrate of FIG. 4.

Figure 5A:
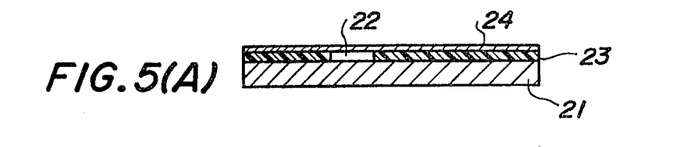
FIGS. 5(A) through 5(F) are schematic sectional views showing fabrication steps of the multi-layer substrate of FIG. 4.

An insulation adhesive sheet 23 is disposed on a metal substrate 21 made of an aluminum plate or a copper plate. The insulation adhesive sheet 23 has an opening 22 for securing a semiconductor chip therein. The insulation adhesive sheet 23 is made of glass cloth impregnated with polyimide resin or polyamideimide resin. Copper foil 24 of some micron meter thickness is attached onto the insulation adhesive sheet 23 as shown in FIG. 5(A).

The adhesive sheet can be made of polyamideimide resin or polymide resin formed except at the opening 22 through the use of a screen printing method. And, the adhesive sheet can be alternatively formed by a half-cured polyimide film or a KERIMIDE film.

Figure 5B:
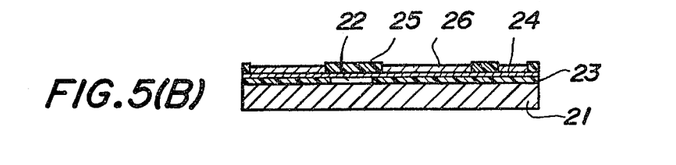

Photo-resists 25 are coated on the copper foil 24 to shape the bottom conductors. A gold layer or a silver layer 26 is formed on the copper foil 24 as shown in FIG. 5(B) through the use of a plating method in order to enhance the bondability.

Figure 5C:
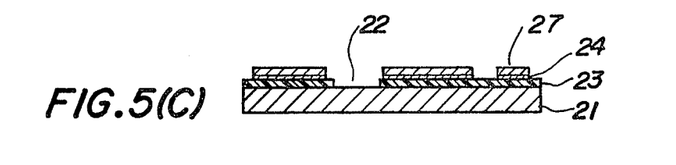

Thereafter, the photo-resists 25 are removed. The copper foil 24 is etched through the use of maskings of the gold or silver layer 26, thereby forming bottom conductors 27 as shown in FIG. 5(C).

Figure 5D:
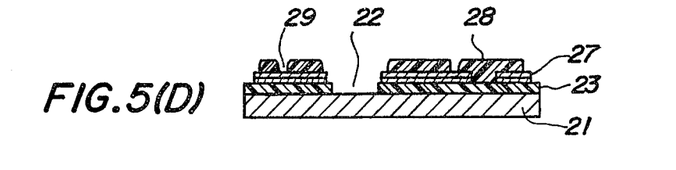

A polyamic acid film 28 of the half-cured condition, which is etchable by sodium hydroxide NaOH or hydrazine, is formed on the insulation adhesive sheet 23 to cover the bottom conductors 27. The polyamic acid film 28 is completely cured by maintaining it at 300° C. for one (1) hour. Through holes 29 are formed in the layer 28 as shown in FIG. 5(D) through the use of the photo-etching method utilizing sodium hydroxide NaOH or hydrazine as the etchant.

The curing operation of the polyamic acid film 28 is as follows:

polyamic acid

HEAT (attach to the insulation adhesive sheet 23 when pressure is applied to)

polyimide

-continued

Figure 5E:
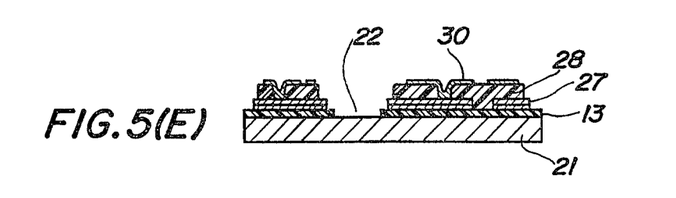
Figure 5F:
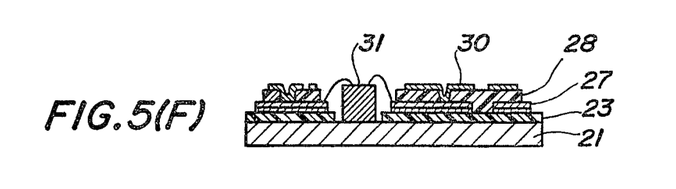

Thereafter, through hole contacts and top conductors 30 are formed as shown in FIG. 5(E) in a same manner as described in connection with the step of FIG. 3(E).

Then, a semiconductor chip 31 is fixed to the metal substrate 21 as shown in FIG. 5(E) in a same manner as described with reference to FIG. 3(G). And, outer leads 32 and the protective coat 20 are formed as shown in FIG. 4.

Figure 6:
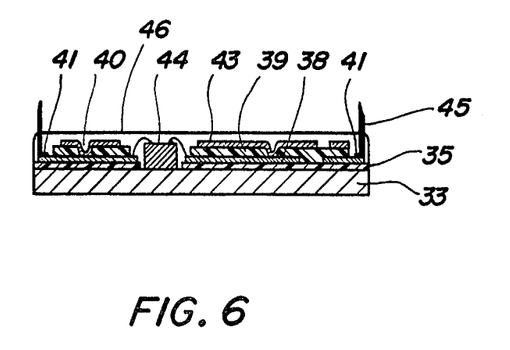
FIG. 6 is a schematic sectional view of still another embodiment of a multi-layer substrate of the present invention.

FIG. 6 shows still another embodiment of a multi-layer substrate of the present invention. FIGS. 7(A) through 7(I) show fabrication steps of the multi-layer substrate of FIG. 6.

A high-insulation adhesive sheet 35, for example KERIMIDE 501 manufactured by RHŌME-POULENC, France, is disposed above a metal substrate 33 made of an aluminum plate or a copper plate. The high-insulation adhesive sheet 35 has an opening 34 for securing a semiconductor chip therein as shown in FIG. 7(A).

Figures 7A, 7B:
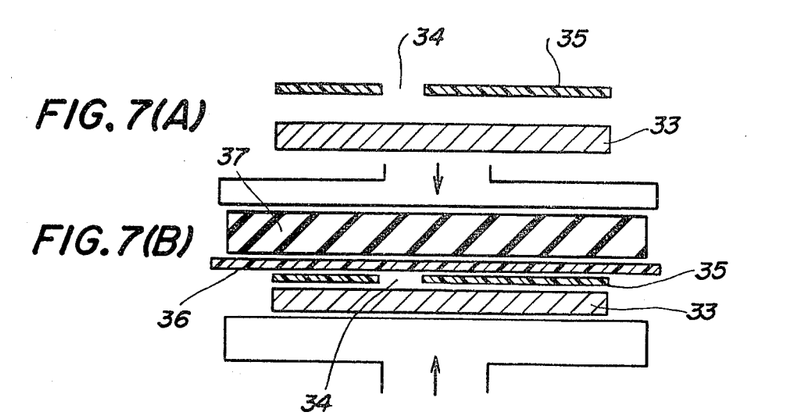
FIGS. 7(A) through 7(I) are schematic sectional views showing fabrication steps of the multi-layer substrate of FIG. 6.

The high-insulation adhesive sheet 35 is attached to the metal substrate 33 by applying them a predetermined pressure and a predetermined temperature through the use of a high-temperature rubber plate 37 and a protective sheet 36 as shown in FIG. 7(B). With this treatment, the high-insulation adhesive sheet 35 is half-cured. A preferred temperature condition is as follows. At 90° C. for thirty (30) minutes, at 150° C. for thirty (30) minutes and then at 200° C. for thirty (30) minutes. The layer 35 can be alternatively formed through the use of adhesive of liquid state or paste state.

Figure 7C:
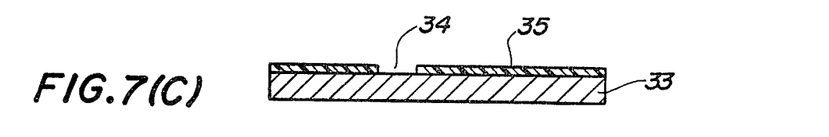
Figure 7D:
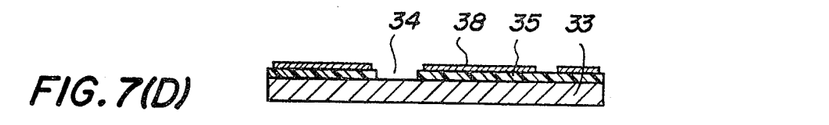

The high-insulation adhesive sheet 35 is fixed to the metal substrate 33 as shown in FIG. 7(C). Thereafter, bottom conductors 38 are formed on the half-cured high-insulation adhesive sheet 35 as shown in FIG. 7(D) through the use of ion deposition techniques.

More specifically, the bottom conductors 38 are formed in either one of the followings ways.

(1) Bottom conductor material is deposited on the whole surface of the adhesive sheet. Then, the conductor pattern of a desired configuration is formed through the use of a photo-etching method.
(2) Firstly, photo-resist is formed on the adhesive sheet in a desired configuration through the use of a photo-etching method. Then, bottom conductor material is deposited and, thereafter, the photo-resist is removed through the use of a lift-off method.

Figure 7E:
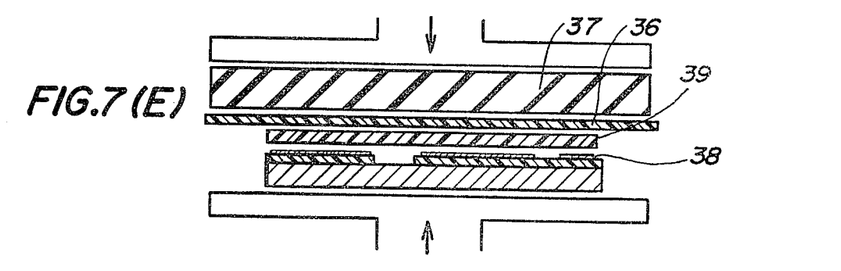
Figure 7F:
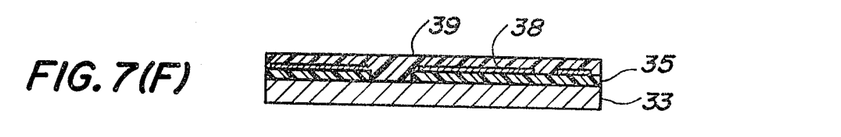

A high-insulation organic film 39, such as a polyimide film is disposed above the high-insulation adhesive sheet 35 so as to cover the bottom conductors 38. The high-insulation organic film 39 is depressed toward the high-insulation adhesive sheet 35 through the use of the high-temperature rubber plate 37 and the protective sheet 36 as shown in FIG. 7(E). The high-insulation adhesive sheet 35 is heated up to 250° C. for one (1) hour, whereby the high-insulation adhesive sheet 35 is completely cured. The metal substrate 33, the high-insulation adhesive sheet 35 and the high-insulation organic film 39 are tightly fixed to each other as shown in FIG. 7(F).

Figure 7G:
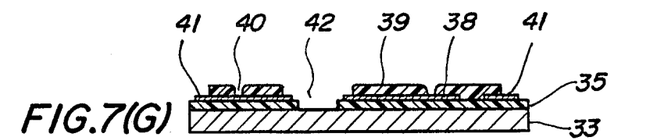

An opening 42, for securing a semiconductor chip therein, and through holes 40 are formed in the high-insulation organic film 39 as shown in FIG. 7(G) through the use of a photo-etching method. This step is similar to that achieved in the step of FIG. 3(E). A substrate pad portion 41 is exposed to the outside.

Figure 7H:
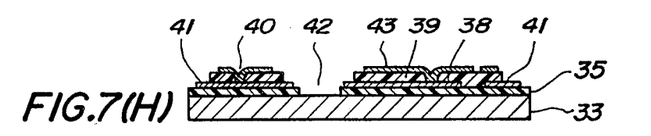

Through hole contacts and top conductors 43 are formed as shown in FIG. 7(H) through the use of ion deposition techniques. This step is similar to that is conducted in the step of FIG. 3(F).

Figure 7I:
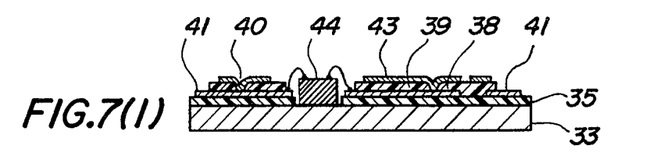

A semiconductor chip 44 is disposed within the opening 42 and fixed to the metal substrate 33 as shown in FIG. 7(I). This step is similar to that is achieved in the step of FIG. 3(G).

Outer leads 45 and a protective coat 46 are formed as shown in FIG. 6.

Preferred material for the metal substrate 33, the high-insulation adhesive sheet 35, the bottom conductors 38, the high-insulation organic layer 39 and the top conductors 43 is listed in the following TABLE II.

TABLE II

| METAL SUBSTRATE | HIGH-INSULATION ADHESIVE SHEET | BOTTOM CONDUCTOR | HIGH-VOLTAGE ORGANIC LAYER | TOP CONDUCTOR |
| --- | --- | --- | --- | --- |
| aluminum plate | KERIMIDE (sheet state or liquid state) | aluminum nickel nickel on aluminum | polyimide film polyamic acid (sheet state or liquid state) | aluminum nickel nickel or aluminum |
| copper plate | polyamic acid (sheet state or liquid state) | copper | KERIMIDE | copper three layer of Al—Ni—Au |

Figures 8A, 8B:
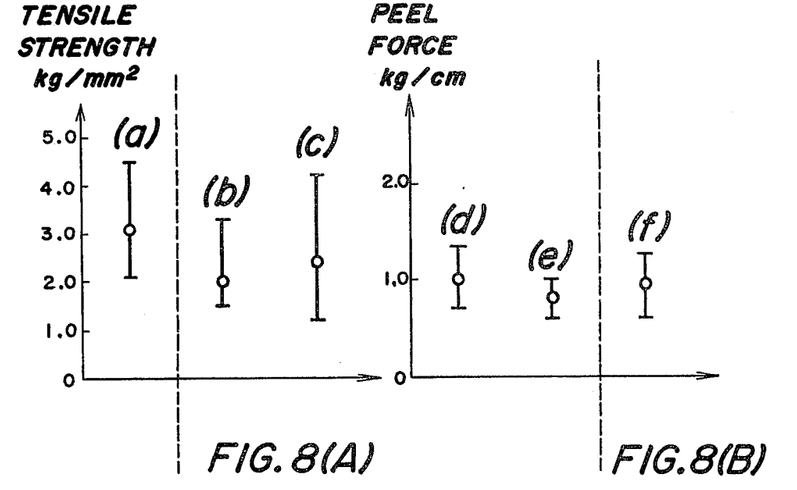
FIG. 8(A) is a graph showing tightness between an aluminum substrate and a KERIMIDE film employed within the multi-layer substrate of the present invention.
FIG. 8(B) is a graph showing tightness between a bottom conductor and a KERIMIDE film, and between a KERIMIDE film and a polyimide film employed within the multi-layer substrate of the present invention.

FIG. 8(A) shows tightness between the aluminum substrate and the KERIMIDE film. In FIG. 8(A), the tensile strength is shown along the ordinate axis.

The tightness between the aluminum substrate and the KERIMIDE film of the present invention is represented as (a), (b) and (c) represent the tightness between the conventional thick film Pd-Au and ceramics, and between the conventionally laminated copper and a polyimide film, respectively, for comparison purposes.

FIG. 8(B) shows thightness between the aluminum bottom conductor and the KERIMIDE film of the present invention as (d), and the tightness between the KERIMIDE film and the polyimide film of the present invention as (e). The peel force is shown along the ordinate axis. In FIG. 8(B), (f) represents the tightness between the laminated copper and a polyimide film of the prior art for comparison purposes.

Figure 9:
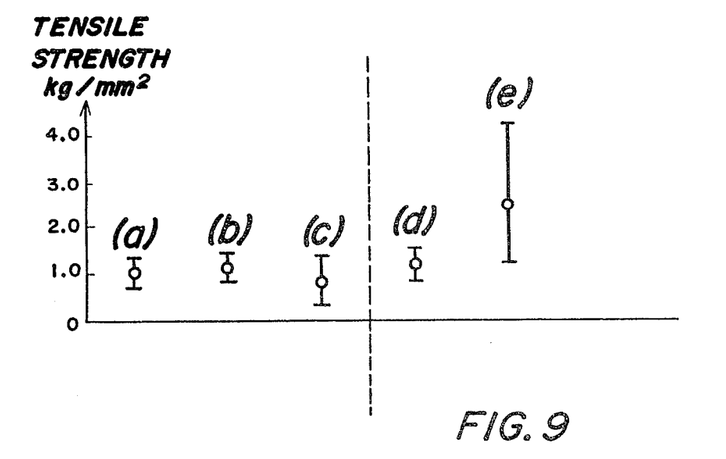
FIG. 9 is a graph showing tightness between a top conductor and a polyimide film employed within the multi-layer substrate of the present invention.

FIG. 9 shows tightness between the top conductors and the polyimide film of the present invention. The ordinate axis shows the tensile strength.

(a) shows tightness between the polyimide film and a two-layer conductor consisting of a nickel layer formed on an aluminum layer, (b) shows tightness between the polyimide film and a three-layer conductor consisting of a gold layer formed on a nickel layer which is formed on an aluminum layer, and (c) shows tightness between the polyimide film and a two-layer conductor consisting of a gold layer formed on a nickel layer. (d) and (e) represent the tightness of the conventional aluminum conductor and the laminated copper film, respectively.

Characteristics of the multi-layer substrate of the present invention are listed in the following TABLE III by comparing with that of the conventional one.

TABLE III

|  | MULTI-LAYER SUBSTRATE OF PRIOR ART | MULTI-LAYER SUBSTRATE OF THE PRESENT INVENTION |
|---|---|---|
| STABLE WIDTH OF CONDUCTOR PATTERN | 150μm | 50μm |
| MINIMUM THROUGH HOLE | diameter: 500μm pitch: 1000μm | diameter: 250μm pitch: 350μm |
| INSULATION | insulation layer must be thicker than 90μm | insulation layer of 10μm thickness shows sufficient insulation |
| LIFE TEST (under 200V, 65° C. and 95% moisture) | leakage current initial: $10^{-7}$–$10^{-8}$A 1000 hours: $10^{-7}$A | leakage current initial: $10^{-11}$–$10^{-12}$A 1000 hours: $10^{-9}$–$10^{-1}$ |
| HEAT RADIATION (chip temperature) | 120° C. (one chip, 2W) 130° C. (two chips, 4W) | 70° C. (one chip, 2W) 80° C. (two chips, 4W) |

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for fabricating a multi-layer substrate comprising the steps of:
   preparing a provisional supporting plate;
   forming bottom thin-film conductors on said provisional supporting plate in a desired pattern;
   attaching a high-insulation adhesive sheet to said provisional supporting plate so as to cover said bottom thin-film conductors;
   half-curing said high-insulation adhesive sheet;
   separating said high-insulation adhesive sheet from said provisional supporting plate in such a manner that said bottom thin-film conductors are mounted on said high-insulation adhesive sheet;
   disposing said separated high-insulation adhesive sheet on a metal plate in such a manner that said bottom thin-film conductors face outward;
   disposing high-insulation organic film on said high-insulation adhesive sheet in such a manner that said high-insulation organic film covers said bottom thin-film conductors;
   curing said high-insulation adhesive sheet to tightly connect said high-insulation adhesive sheet to said metal plate and said high-insulation organic film; and
   forming top conductors on said high-insulation organic film.

2. A method for fabricating a multi-layer structure comprising the steps of:
   providing a metal plate;
   attaching a partially cured high-insulation adhesive sheet to said plate;
   forming bottom thin-film conductors on said partially cured high-insulation adhesive sheet;
   covering said bottom thin-film conductors with a high-insulation organic film;
   completely curing said high-insulation adhesive sheet;
   forming through holes;
   forming a conductor pattern on said high-insulation orgnaic film subsequent to said step of forming said through holes.

3. The method of claim 2 wherein said step of completely curing said high-insulation adhesive sheet is performed by the application of high temperatures and pressures.

* * * * *